United States Patent [19]

Nemiroff

[11] Patent Number: 4,832,788

[45] Date of Patent: May 23, 1989

[54] METHOD OF FABRICATING A TAPERED VIA HOLE IN POLYIMIDE

[75] Inventor: Michael H. Nemiroff, Del Mar, Calif.

[73] Assignee: Unisys Corporation, Blue Bell, Pa.

[21] Appl. No.: 53,554

[22] Filed: May 21, 1987

Related U.S. Application Data

[63] Continuation of Ser. No. 780,833, Sep. 27, 1985, abandoned.

[51] Int. Cl.$^4$ .......................................... H01L 21/312
[52] U.S. Cl. .................................. 156/643; 156/644; 156/652; 156/653; 156/661.1; 156/668; 437/203; 437/235; 437/947; 437/981
[58] Field of Search ............... 156/643, 644, 651, 652, 156/661.1, 668; 437/235, 203, 947, 981; 148/DIG. 161

[56] References Cited

U.S. PATENT DOCUMENTS

| | | | |
|---|---|---|---|
| 4,472,240 | 9/1984 | Kameyama | 156/648 |
| 4,484,979 | 11/1984 | Stocker | 156/643 |
| 4,487,652 | 12/1984 | Almgren | 156/643 |
| 4,495,220 | 1/1985 | Wolf et al. | 156/644 X |
| 4,514,252 | 4/1985 | Roland | 156/643 |
| 4,522,681 | 6/1985 | Gorowitz et al. | 156/643 |
| 4,560,436 | 12/1985 | Bukhman et al. | 156/643 |
| 4,592,802 | 6/1986 | Deleonibus et al. | 156/644 |

FOREIGN PATENT DOCUMENTS 60-140720  7/1985  Japan .................................. 437/947

Primary Examiner—David L. Lacey
Assistant Examiner—Andrew J. Anderson
Attorney, Agent, or Firm—Charles J. Fassbender; Kenneth L. Miller

[57] ABSTRACT

A method of fabricating a tapered via hole in a polyimide layer of an integrated circuit includes the steps of: disposing a layer of SiO$_2$ on the polyimide layer and a layer of photoresist on the SiO$_2$ such that the layers have an opening which exposes a region of the polyimide layer for the via hole; etching the exposed polyimide region partway through the polyimide layer, while simultaneously etching back the photoresist on the sidewalls of the opening to thereby uncover a strip of SiO$_2$ adjacent to the perimeter of the exposed polyimide region; enlarging the exposed region of the polyimide by etching the uncovered strip of SiO$_2$; and repeating the etching step and enlarging step a predetermined number of times.

8 Claims, 4 Drawing Sheets

METHOD OF FABRICATING A TAPERED VIA HOLE IN POLYIMIDE

This is a continuation of co-pending application Ser. No. 780,833 filed on Sept. 27, 1985, now abandoned.

BACKGROUND OF THE INVENTION

This invention relates to integrated circuits; and more particularly, it relates to methods for fabricating metal interconnections within the circuit.

Basically, an integrated circuit is comprised of a semiconductor substrate having a surface in which a plurality of transistors are fabricated. These transistors are selectively connected by one or more levels of metal conductors which overlie the transistors on respective insulating layers. Metal coated via holes through the insulating layers are used to interconnect different levels of the conductors.

However, a substantial problem with this type of structure is that there is a natural tendency for the metal coating in the via holes to be thinner than the metal conductors which lie on the insulating layers. This decrease in thickness can result in the resistance through the via holes being too high for the circuit to work properly, or it can result in an actual open circuit. Via holes having a high aspect ratio (i.e., a large depth to width ratio) are most susceptible to this problem.

To solve the above described problem, the thickness of the metal coating in the via holes cannot be increased simply by increasing the thickness of the metal conductors on the insulating layers. This is because each conductor is essentially rectangular in cross section, and so it forms a step on the insulating layer on which it lies.

When an insulating layer is deposited over a large step, the thickness of the insulating layer is not uniform. Instead, the insulating layer is thin on the side of the step and this can cause shorts to occur. Also, when a layer of photoresist is deposited over a large step, the resist tends to thin out on the top of the step. This can result in the resist being inadvertently stripped from the top of the step during a subsequent patterning process. Consequently, a dilemma exists wherein increasing the thickness of the metal coating in via holes by depositing more metal aggravates the step coverage problem.

Accordingly, a primary object of the invention is to provide an improved method of fabricating metal interconnections in an integrated circuit which overcomes the above described problem.

BRIEF SUMMARY OF THE INVENTION

In accordance with the invention, the above object is achieved by forming each level of conductors on an insulating layer of polyimide, and interconnecting different levels of the conductors by metal coated via holes through the polyimide which are tapered; wherein these tapered via holes are formed by the steps of:

disposing a layer of $SiO_2$ on the polyimide layer and a layer of photoresist on the $SiO_2$ layer such that the layers have an opening which exposes a region of the polyimide layer for the via hole;

etching the exposed polyimide region partway through the polyimide layer, while simultaneously etching back the photoresist on the sidewalls of the opening to thereby uncover a strip of the $SiO_2$ adjacent to the perimeter of the exposed polyimide region;

enlarging the exposed region of the polyimide by etching the uncovered strip of the $SiO_2$; and repeating the etching step to remove additional polyimide from the exposed polyimide region and further etch back the photoresist on the sidewalls of the opening.

DETAILED DESCRIPTION OF THE INVENTION

Figure 1:
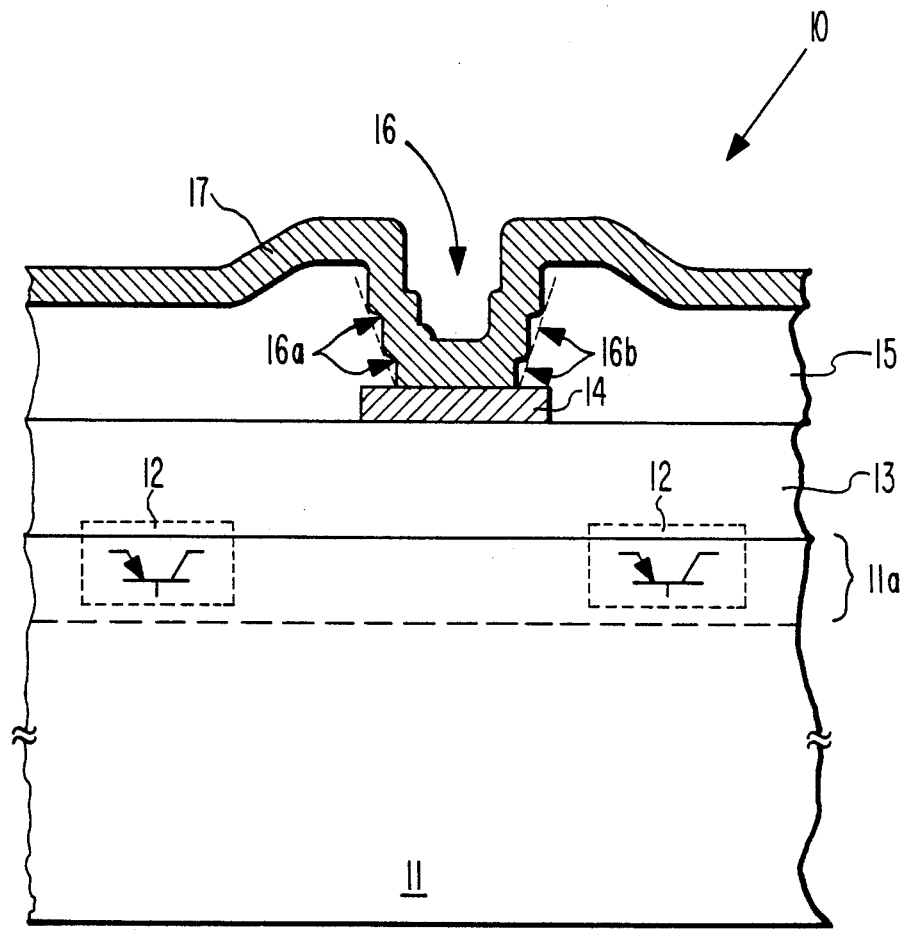
FIG. 1 is a greatly enlarged cross-sectional view of a metal coated via hole which is tapered in accordance with the invention.

Referring now to FIG. 1, the details of one preferred embodiment 10 of the invention will be described. Embodiment 10 includes a semiconductor substrate 11 having a plurality of bipolar transistors 12 which are integrated into a top surface region 11a of the substrate. These transistors 12 are conventional in form and so they are only represented schematically.

Overlying the transistors 12 is an $SiO_2$ layer 13. One level of conductors 14 for interconnecting the transistors 12 lie on top of layer 13. A layer of polyimide 15 lies on layer 13, and it also covers the conductors 14 except for via holes 16 that expose selected regions of the conductors. Another level of metal conductors 17 overlies the polyimide layer 16, and the metal of those conductors coats the sidewalls of via holes 16 to thereby make electrical contact with the conductors 14.

A primary feature of the above described embodiment 10 is that each via hole 16 has tapered sidewalls. In one embodiment, this taper is shaped like a plurality of stairs 16a. In another embodiment, the sidewalls have the tapered shape 16b. In either case, these tapers 16a and 16b enhance the thickness with which the metal of the conductors 17 is deposited on the sidewalls relative to its thickness on the top of polyimide layer 15.

FIGS. 2A-2H illustrate the preferred process for fabricating the tapered vias 16. In these figures, reference numeral 15 indicates the same polyimide layer as shown in FIG. 1. All of the structures which underlie layer 15 (e.g., components 11-15) are fabricated by conventional steps which are not re-illustrated here.

Figure 2A:
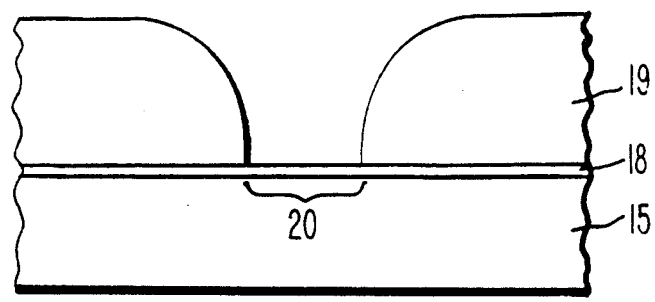
FIGS. 2A-2H illustrate the steps for fabricating the FIG. 1 structure in accordance with the invention.

Beginning first with FIG. 2A, a thick polyimide layer 15 (e.g., - 3 um) is deposited in an unpatterned form on the underlying components 14 and 15. Thereafter, a thin $SiO_2$ layer 18 (e.g., - 0.3 um) is deposited on polyimide layer 15, and a thick photoresist layer 19 (e.g., - 3 um) is deposited on layer 18. A selected portion of the resist 19 (e.g., - a 3 um×3 um square) is then removed over a region 20 of the polyimide 15 where each via hole 16 is to be made. This is achieved by exposing the photoresist 19 over region 20 to light and subsequently selectively etching the exposed resist.

Thereafter, the resulting structure is subjected to a sequence of reactive ion etches as illustrated in FIGS. 2B-2G. In this sequence, two different reactive ion gases are used. One of the gases 21 etches $SiO_2$ while the other gas 22 etches both photoresist and polyimide. Suitably, gas 21 is 75 SCCM of $CHF_3$+3 SCCM $O_2$ and gas 22 is 70 SCCM of $O_2$. (SCCM is standard cubic centimeters per minute.)

Figure 2B:
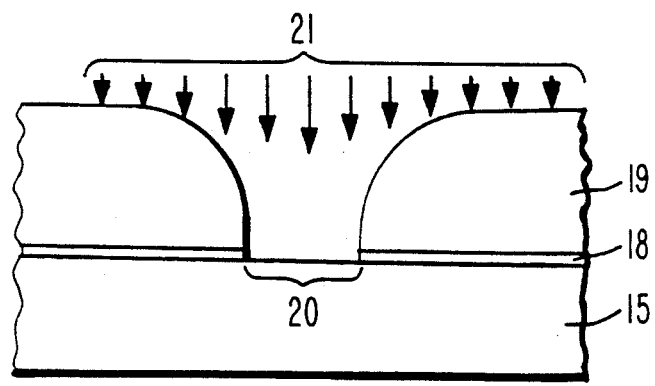
Figure 2C:
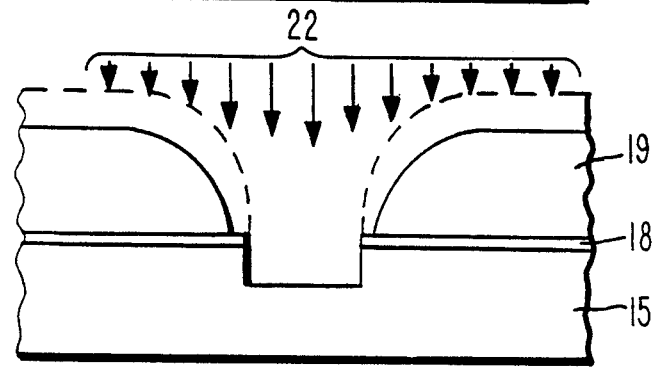

Initially, as illustrated in FIG. 2B, a reactive ion etch is performed with gas 21 to remove the exposed $SiO_2$ of layer 18 above region 20. Thereafter, as illustrated in FIG. 2C, a reactive ion etch occurs with gas 22 to etch partway through (e.g., - about 1 um into) polyimide layer 15 in region 20.

At the same time, the photoresist 14 on the sidewalls of the opening to region 20 is etched back by gas 22. This etch back is 0.1 to 0.5 times the depth to which region 20 is etched. As the slope of the resist 14 on the sidewalls is made more vertical, the amount of etch back decreases.

Figure 2D:
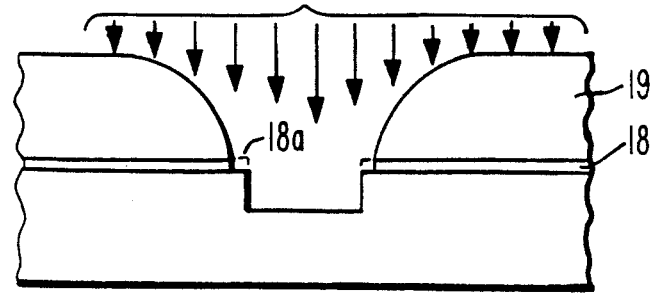

Subsequently, as illustrated in FIG. 2D, another reactive ion etch is made with gas 21. This removes a strip 18a of $SiO_2$ which was uncovered by the etch of FIG. 2C, and thus the size of the exposed polyimide region 20 is enlarged.

Figure 2E:
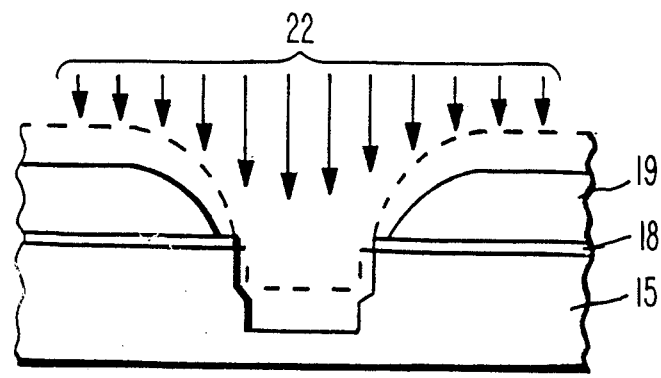

Thereafter, as illustrated in FIG. 2E, another reactive ion etch is made with gas 22. This etches the exposed polyimide region 20 further into (e.g., - another 1 um into) but not through layer 15, and it also simultaneously etches back the photoresist 19 on the sidewalls of the opening to region 20.

Figure 2F:
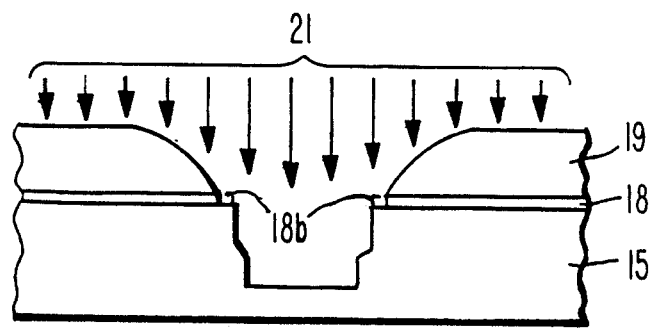

Thereafter, as illustrated in FIG. 2F, still another reactive ion etch is made with gas 22. This removes another strip 18b of the $SiO_2$ layer which was uncovered by the etch of FIG. 2E and thus the size of the exposed polyimide region 20 is again enlarged.

Figure 2G:
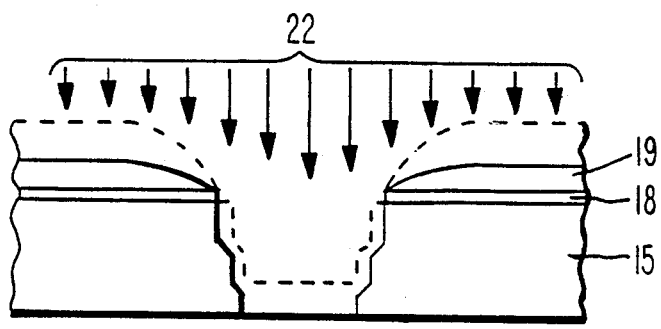
Figure 2H:
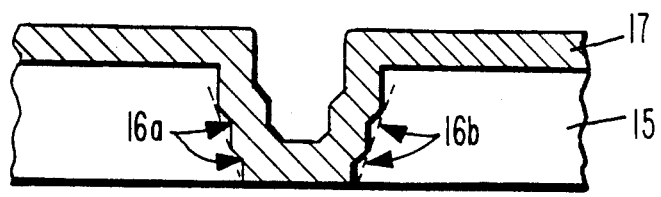

Subsequently, as illustrated in FIG. 2G, a final reactive ion etch is made with gas 22. This etch penetrates the polyimide layer 15 in the exposed region 20 and thus completes the formation of via hole 16. Thereafter, any remaining photoresist 19 along with $SiO_2$ layer 18 is stripped from the FIG. 2G structure, and the patterned metal conductors 17 are deposited as illustrated in FIG. 2H.

When the $SiO_2$, photoresist, and polyimide are etched as described above, it might appear that the sidewalls of the via 16 would always be formed with a staircase shape. However, as the dimensions of the steps decrease, the corners of the steps tend to smooth out. Consequently, the sidewalls can have shape 16b in which there is just one small vertical step at the top of the via and a smooth taper through the remainder of the via.

Preferably, each of the etching steps with gas 22 penetrates only 0.2–1.5 microns into polyimide layer 15. This, as has been verified by experiment, enables the metal 17 at all locations on the sidewalls of the via to be at least 40% as thick as the metal 17 on top of polyimide layer 15.

Figure 3:
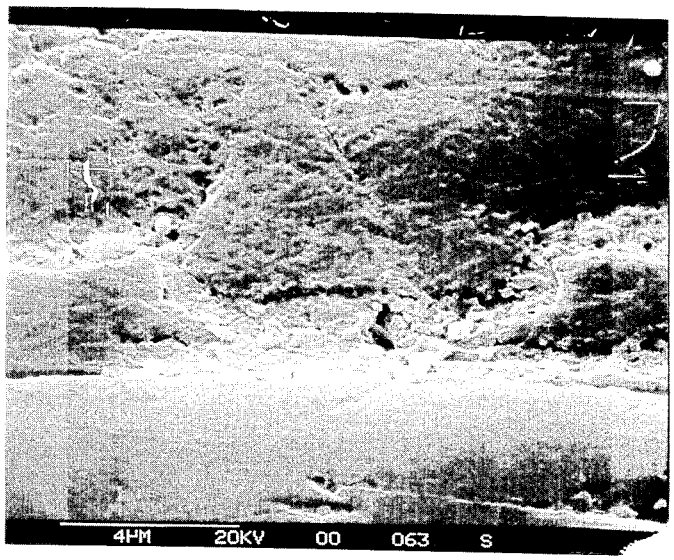
FIG. 3 is a microphotograph of an actually fabricated FIG. 1 structure.

A microphotograph of an actual metal coated via hole which was fabricated with the above described process is illustrated in FIG. 3. Inspection of this photograph shows that the metal conductor 17 on top of the polyimide layer 15 is about 1.0 microns thick; and the metal on the sidewalls of the via is about 0.5 to 1.0 microns thick.

Figure 4:
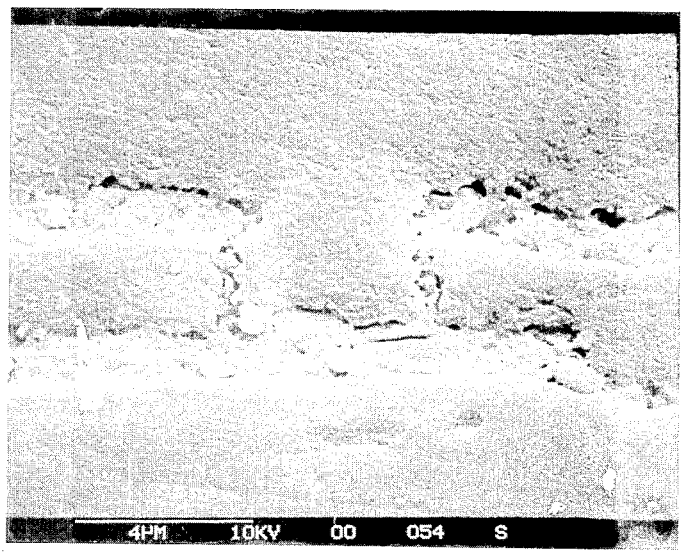
FIG. 4 is a microphotograph, for comparison purposes, of a metal coated via hole of the prior art.

By comparison, FIG. 4 is a microphotograph of a similar circuit in which the via hole is formed with vertical walls. This figure shows that the metal conductor on the top of the polyimide layer is again 1.0 microns thick; but the metal on certain portions of the vertical sidewalls is only about 0.1 microns thick.

A preferred embodiment of the invention and method for forming the same has now been described in detail. In addition, however, many changes and modifications can be made to these details without departing from the nature and spirit of the invention.

For example, the number of times that gas 21 and gas 22 are used during the etching steps may be increased as the thickness of the polyimide layer 15 is increased. In FIGS. 2A-2H, a total of three etches are made with gas 22 to depict the situation where the polyimide layer is three microns thick and each etch with gas 22 penetrates one micron into that layer.

As another modification, polyimide layer 15 may be replaced by any organic insulating material for integrated circuits, $SiO_2$ layer 18 may be replaced by any inorganic insulating material such as titanium, and the photoresist 19 may be replaced by any organic masking material such as polymethyl methacrylate. What is important here is that the organic materials that are used for layers 15 and 19 etch at essentially the same rate in gas 22 but do not etch appreciably in gas 20; while the inorganic material used for layer 18 selectively etches in gas 21 but not in gas 22.

Accordingly, since many such changes can be made to the above described details, it is to be understood that the invention is not limited to those details but is defined by the appended claims.

What is claimed is:

1. A method of fabricating a stepped via hole in a polyimide layer of an integrated circuit, including the steps of:

disposing a layer of $SiO_2$ on said polyimide layer and a layer of photoresist on said $SiO_2$ layer such that said layers define an opening which exposes a region of said polyimide layer for said via hole;

etching said exposed polyimide region partway through said polyimide layer, while simultaneously etching back said photoresist on the sidewalls of said opening to thereby uncover a strip of said $SiO_2$ adjacent the perimeter of said exposed polyimide region;

enlarging the exposed region of said polyimide by etching said uncovered strip of said $SiO_2$; and subsequently, forming a step in said polyimide layer by repeating said etching step to remove additional polyimide from the enlarged exposed polyimide region and to further etch back said photoresist on the sidewalls of said opening.

2. A method according to claim 1 wherein said polyimide layer is etched completely through by performing said enlarging step at least twice and following each such step with said etching step.

3. A method according to claim 1 wherein said polyimide layer is at least 2.0 microns thick, and wherein each performance of said etching step removes only 0.2–1.5 microns of said polyimide layer.

4. A method according to claim 1 wherein the etching of said polyimide occurs perpendicular to said layers substantially faster than it occurs parallel to said layers so said stepped via hole is fabricated with a narrow end which nearly matches the region of said polyimide that is initially exposed by said disposing step.

5. A method according to claim 1 wherein said etching and enlarging steps are performed by reactive ion etching with respective ions that are different from each other.

6. A method according to claim 1 wherein said polyimide layer is etched completely through by repeating said etching and enlarging steps a predetermined number of times; and thereafter, a patterned metal layer is disposed with a first thickness on said polyimide layer, and simultaneously is disposed on the sidewalls of said exposed polyimide region which remains after said etching steps with a second thickness that is at least 40% of said first thickness.

7. A method according to claim 1 wherein said $SiO_2$ layer is less than one-fifth the thickness of said photoresist layer.

8. A method of fabricating a stepped via hole in an organic insulating layer of an integrated circuit, including the steps of:

disposing an inorganic mask layer on said organic insulating layer and an organic mask layer on said inorganic mask layer such that said mask layers define an opening which exposes a region of said insulating layer for said via hole;

etching said exposed insulating region partway through, while simultaneously etching back said organic mask layer on the sidewalls of said opening to thereby uncover a strip of said inorganic mask layer at the perimeter of said exposed insulating region;

enlarging the exposed region of said insulating layer by etching said uncovered strip of said inorganic mask layer; and subsequently, forming a step in said insulating layer by repeating said etching step to remove additional organic insulating material from the enlarged exposed region and to further etch back said organic mask layer on the sidewalls of said opening.

* * * * *